(12) United States Patent
Sohn et al.

(10) Patent No.: US 10,152,070 B1
(45) Date of Patent: Dec. 11, 2018

(54) ANALOG BLOCK IMPLEMENTED WITH BAND-GAP REFERENCE SCHEME AND RELATED DRIVING METHOD

(71) Applicant: HIMAX IMAGING LIMITED, Tainan (TW)

(72) Inventors: Youngchul Sohn, Tainan (TW); Kwangoh Kim, Tainan (TW); Amit Mittra, Tainan (TW)

(73) Assignee: HIMAX IMAGING LIMITED (TW)

( * ) Notice: Subject to any disclaimer, the term of this patent is extended or adjusted under 35 U.S.C. 154(b) by 0 days.

(21) Appl. No.: 15/665,436

(22) Filed: Aug. 1, 2017

(51) Int. Cl.
G05F 3/16 (2006.01)
G05F 1/56 (2006.01)
H03K 19/20 (2006.01)
H04N 5/369 (2011.01)

(52) U.S. Cl.
CPC ............ *G05F 1/56* (2013.01); *H03K 19/20* (2013.01); *H04N 5/3698* (2013.01)

(58) Field of Classification Search
CPC ......... G05F 1/56; H03K 19/20; H04N 5/3698
USPC ................................................. 327/539–543
See application file for complete search history.

(56) References Cited

U.S. PATENT DOCUMENTS 5,999,055 A    12/1999  Kimura
7,664,611 B2*  2/2010   Luo ........................... G05F 1/46
                                                            702/64
8,330,532 B2* 12/2012   Nikolov .................... G05F 3/20
                                                           323/280

* cited by examiner

*Primary Examiner* — Dinh T Le
(74) *Attorney, Agent, or Firm* — Su IP Consulting

(57) ABSTRACT

An analog block implemented with a band-gap reference scheme for use in a device includes a mode control unit and a band-gap reference circuit. The mode control unit is configured to generate a mode selection signal associated with the operational mode of the device. The band-gap reference circuit includes a bias generator, an error amplifier, and a band-gap loop circuit. The bias generator is configured to provide a band-gap reference voltage in a first bias state when the device operates in a normal mode or in a second bias state when the device operates in a standby mode. The error amplifier is configured to generate an error voltage according to the bias voltage. The band-gap loop circuit is configured to provide a band-gap reference voltage according to the error voltage. First current flowing through the bias generator in the first bias state is larger than second current flowing through the bias generator in the second bias state.

18 Claims, 9 Drawing Sheets

ANALOG BLOCK IMPLEMENTED WITH BAND-GAP REFERENCE SCHEME AND RELATED DRIVING METHOD

BACKGROUND

Unless otherwise indicated herein, the approaches described in this section are not prior art to the claims in this application and are not admitted to be prior art by inclusion in this section.

The demand for less expensive and yet more reliable integrated circuit components for use in mobile communication, imaging and high-quality video applications continues to increase rapidly. As a result, integrated circuit manufacturers are requiring greater accuracy in voltage references for such components and devices to meet the design requirements of such myriad emerging applications. Voltage references are generally required to provide a substantially constant output voltage despite gradual or momentary changes in input voltage, output current or temperature. In particular, many designers have utilized band-gap reference circuits due to their ability to provide a stable voltage supply that is insensitive to temperature variations over a wide temperature range.

Band-gap reference circuits are widely used in the analog blocks of an image sensor. An image sensor is configured to work in a power-down mode, a standby mode, and a normal (streaming) mode. In the power-down mode, the image sensor is turned off. After being powered up, the image sensor first enters the standby mode in order to get ready for operations in the normal mode. In the normal mode, the image sensor is configured to receive and output optical images, and a band-gap reference circuit is used for supplying all necessary reference voltages or current. The image sensor may also switch from the normal mode to the standby mode when it had not been used by any program for a predetermined period of time.

FIG. 1 is a timing diagram illustrating the operations of a band-gap reference circuit for use in the analog blocks of an image sensor. Before T1 when the image sensor is powered off (e.g., in power-down mode), the band-gap reference circuit operates in an OFF mode and the band-gap reference voltage $V_{BG}$ is zero. At T1 and after being powered on, the image sensor enters the standby mode and then the normal mode, the prior art band-gap reference circuit operates in an ON mode, and the band-gap reference voltage $V_{BG}$ ramps up in order to reach its nominal level for the normal mode operations of the image sensor. At T5 when the image sensor is powered off (e.g., in power-down mode), the band-gap reference circuit is turned off, and the band-gap reference voltage $V_{BG}$ drops to zero. Between T3 and T4, the image sensor may switch to the standby mode, during which no band-gap reference voltage is required. Since the prior art band-gap reference circuit stills outputs the band-gap reference voltage $V_{BG}$ of the nominal level in the ON mode even if the image sensor temporarily operates in the standby mode, the prior art image sensor may immediately resume normal mode operations after being waked up at T4. However, such prior art band-gap reference circuit consumes significant amount of power.

FIG. 2 is a timing diagram illustrating the operations of another band-gap reference circuit for use in the analog blocks of an image sensor. Before T1 when the image sensor is powered off (e.g., in power-down mode), the band-gap reference circuit operates in an OFF mode, and the band-gap reference voltage $V_{BG}$ is zero. At T1 and after being powered on, the image sensor enters the standby mode and then the normal mode, and the band-gap reference circuit operates in an ON mode. The band-gap reference voltage $V_{BG}$ ramps up in order to reach its nominal level for normal mode operations of the image sensor. At T3 when the image sensor switches to the standby mode, the band-gap reference circuit is turned off, and the band-gap reference voltage $V_{BG}$ drops to zero. At T4 when the image sensor switches back to the normal mode, the band-gap reference circuit operates in the ON mode, and the band-gap reference voltage $V_{BG}$ takes Ts amount of time to ramp up and reach its nominal level for normal mode operations of the image sensor. At T5 when the image sensor is powered off (e.g., in power-down mode), the band-gap reference circuit is turned off, and the band-gap reference voltage $V_{BG}$ drops to zero. Since the prior art band-gap reference circuit is turned off when the image sensor temporally operates in the standby mode, power consumption can be reduced. However, since there are many capacitor loads in the image sensor, it may take a lot of settling time for the image sensor to resume normal mode operations after switching from the standby mode to the normal mode.

It would therefore be desirable to provide a band-gap reference circuit with low power consumption and shortened settling time.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. The disclosure will be described with additional specificity and detail through use of the accompanying drawings.

DETAILED DESCRIPTION

The technical details set forth in the following description enable a person skilled in the art to implement one or more embodiments of the present disclosure.

Figure 1:
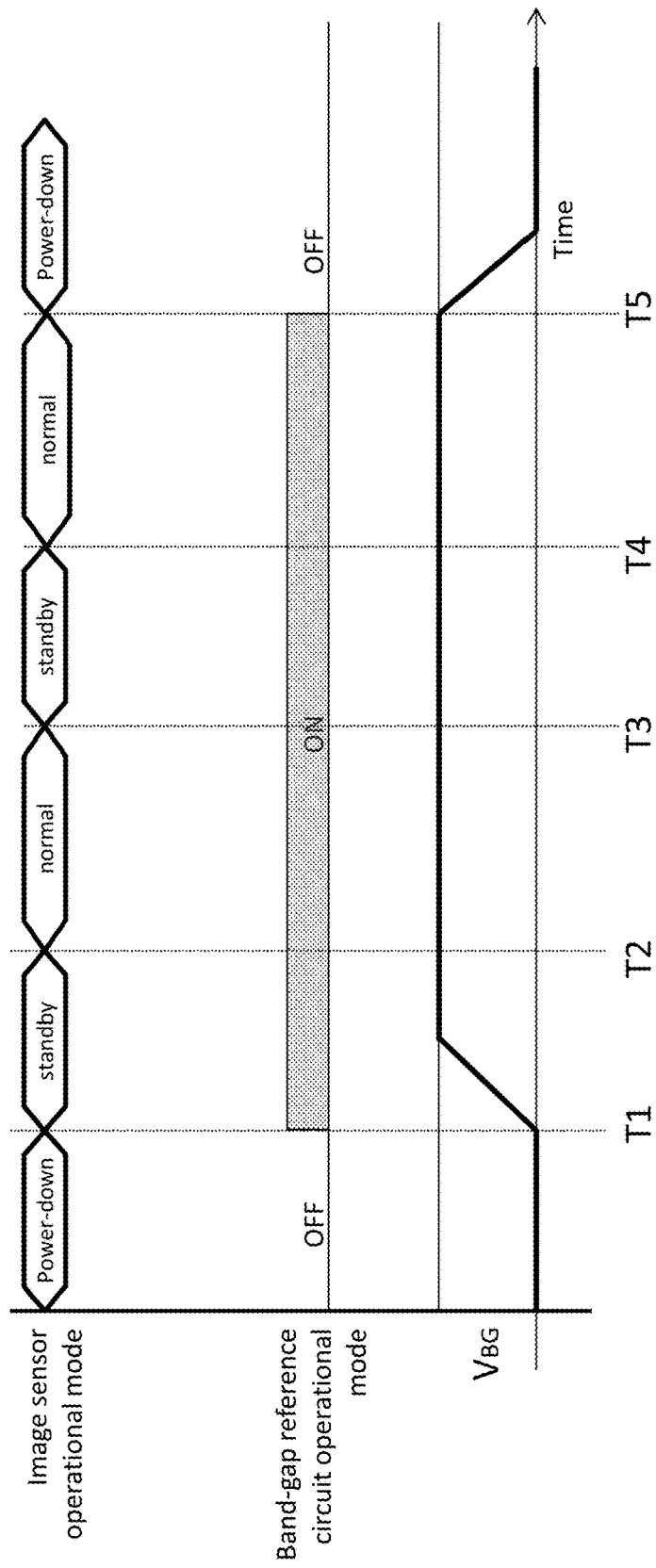
FIG. 1 is a timing diagram illustrating the operations of a band-gap reference circuit for use in the analog blocks of an image sensor.
Figure 2:
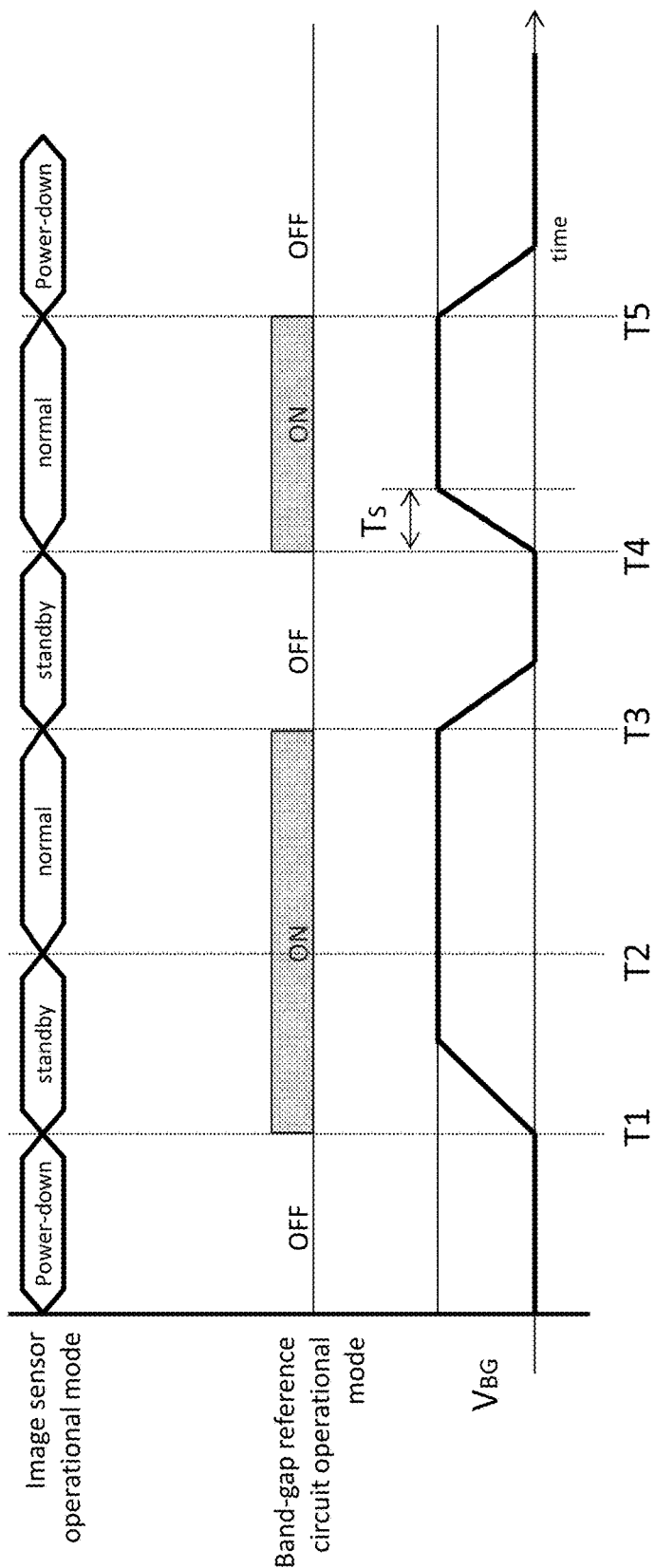
FIG. 2 is a timing diagram illustrating the operations of another band-gap reference circuit for use in the analog blocks of an image sensor.
Figure 3:
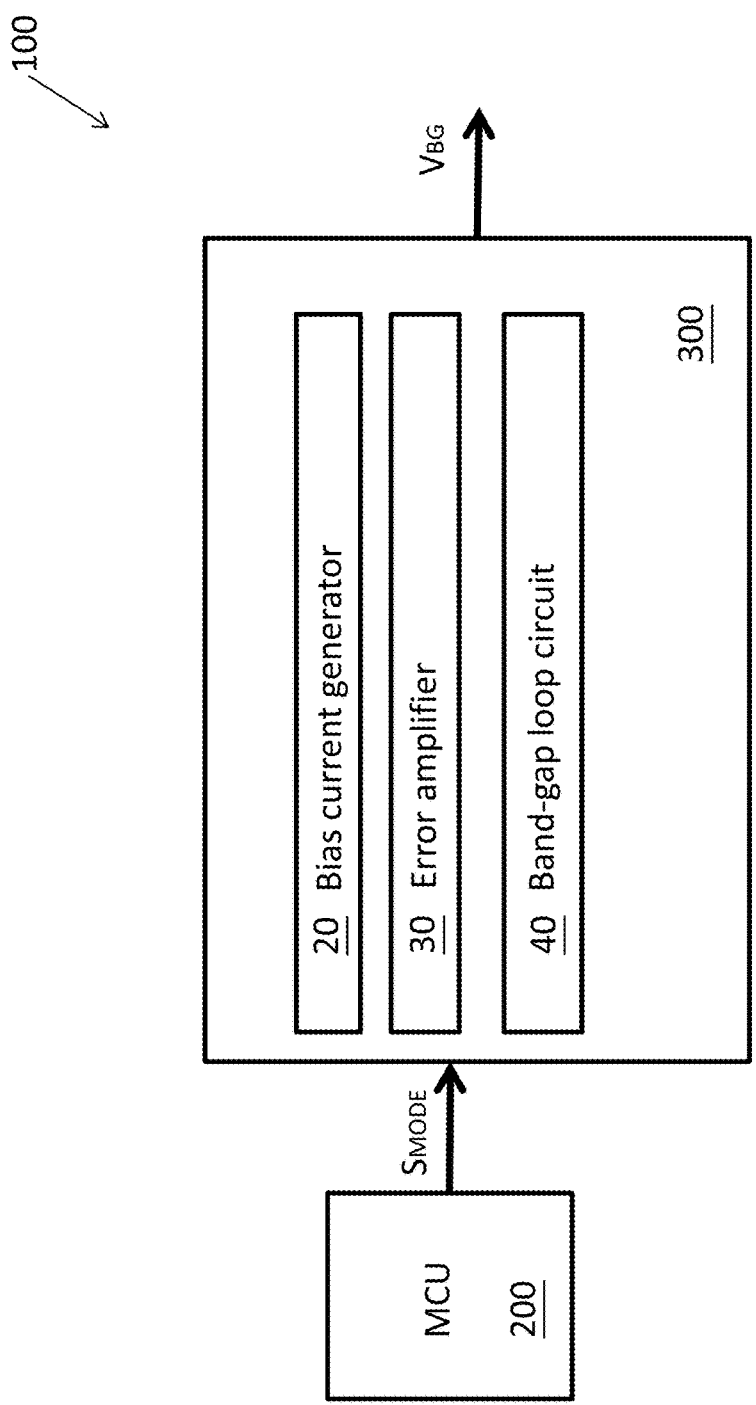
FIG. 3 is a functional diagram of an analog block implemented with a band-gap reference scheme in accordance with at least some embodiments of the present disclosure.

FIG. 3 is a functional diagram of an analog block 100 implemented with a band-gap reference scheme in accordance with at least some embodiments of the present disclosure. The analog block 100 includes a mode control unit (MCU) 200 and a band-gap reference circuit 300. The band-gap reference circuit 300 includes a bias generator 20, an error amplifier 30, and a band-gap loop circuit 40. The band-gap reference circuit 300 is configured to supply at least a band-gap reference voltage $V_{BG}$ according to a mode selection signal $S_{MODE}$ generated by the MCU 200. More specifically, the band-gap reference circuit 300 is configured to operate in an OFF mode, a low-power mode or an ON mode according to the mode selection signal $S_{MODE}$, wherein the bias condition of the band-gap reference circuit 300 and the level of the band-gap reference voltage $V_{BG}$ depend on the operational mode of the band-gap reference circuit 300.

In accordance with some embodiments of the present disclosure, the analog block 100 may be any analog IPs of an image sensor, including, but not limited to, a phase-locked loop (PLL), a low dropout regulator (LDO), an analog-to-digital converter (ADC), or a pixel readout circuit. For illustrative purpose, the application of the analog block 100 in an image sensor is used for explaining the present disclosure. However, the present analog block 100 may also be used in other devices which require band-gap references.

Figure 4:
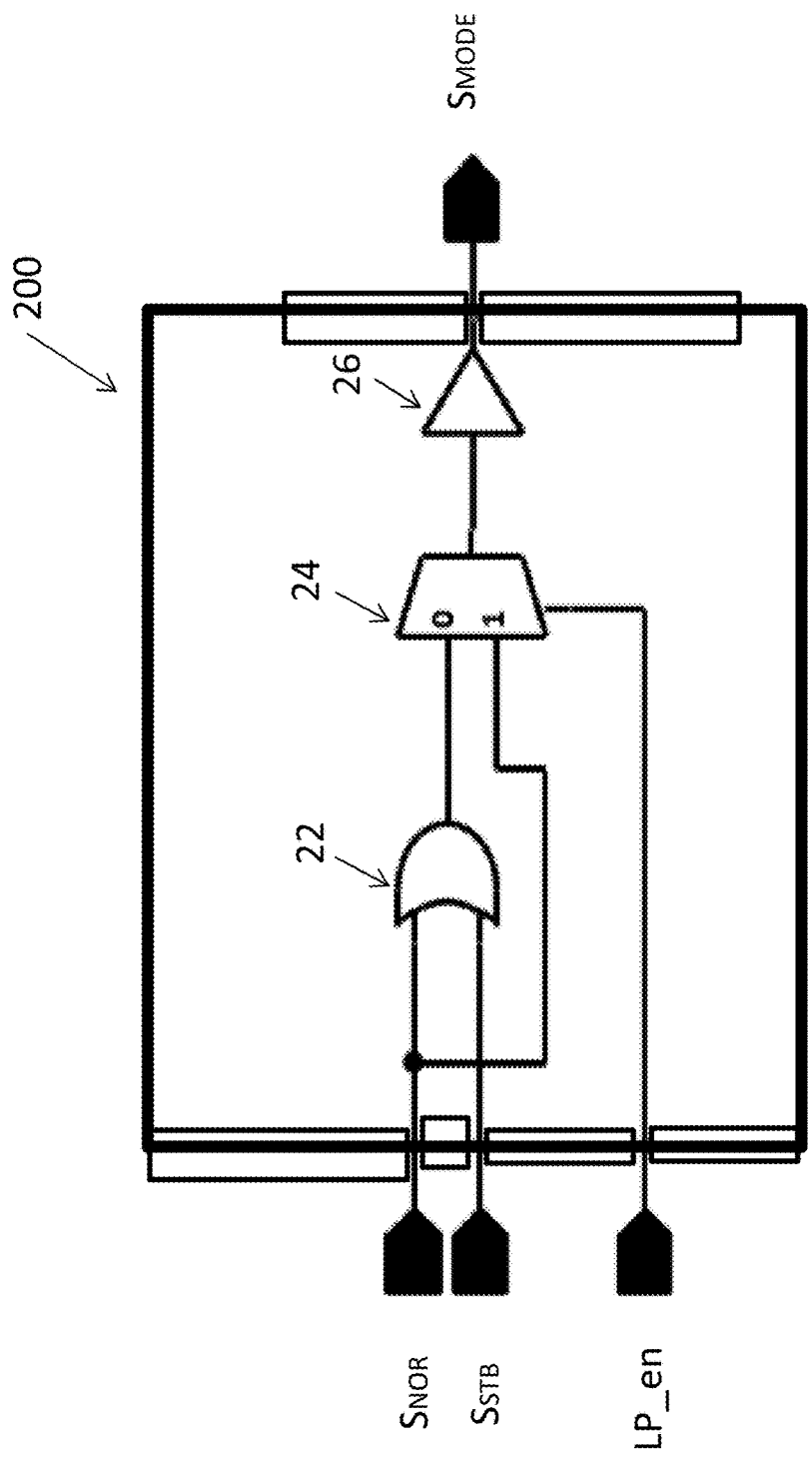
FIG. 4 is a schematic diagram of an MCU in accordance with at least some embodiments of the present disclosure.

FIG. 4 is a schematic diagram of the MCU 200 in accordance with at least some embodiments of the present disclosure. The MCU 200 is configured to generate the mode selection signal $S_{MODE}$ according to control signals $S_{NOR}$, $S_{STB}$ and LP_en received from a digital block of the image sensor. In the embodiment illustrated in FIG. 4, the MCU 200 may be implemented using an OR gate 22, a multiplexer 24 and a buffer 26. The OR gate includes a first input coupled to receive the control signal $S_{NOR}$, a second input coupled to receive the control signal $S_{STB}$, and an output end. The multiplexer 24 includes a first input coupled to the output end of the OR gate 22, a second input coupled to receive the control signal $S_{STB}$, and a select line coupled to receive the control signal LP_en, and an output end. The buffer 26 includes an input coupled to the output end of the multiplexer 24, and an output end for outputting the mode selection signal $S_{MODE}$ according to the control signals $S_{NOR}$, $S_{STB}$ and LP_en. When the image sensor operates in the normal mode during which the control signal $S_{NOR}$ is set "high" (logic 1), the control signal $S_{STB}$ is set "low" (logic 0), and the control signal LP_en is set "low", the MCU 200 is configured to output a "high" mode selection signal $S_{MODE}$. When the image sensor operates in the standby mode during which the control signal $S_{NOR}$ is set "low", the control signal $S_{STB}$ is set "high", and the control signal LP_en is set "high", the MCU 200 is configured to output a "low" mode selection signal $S_{MODE}$.

Figure 5:
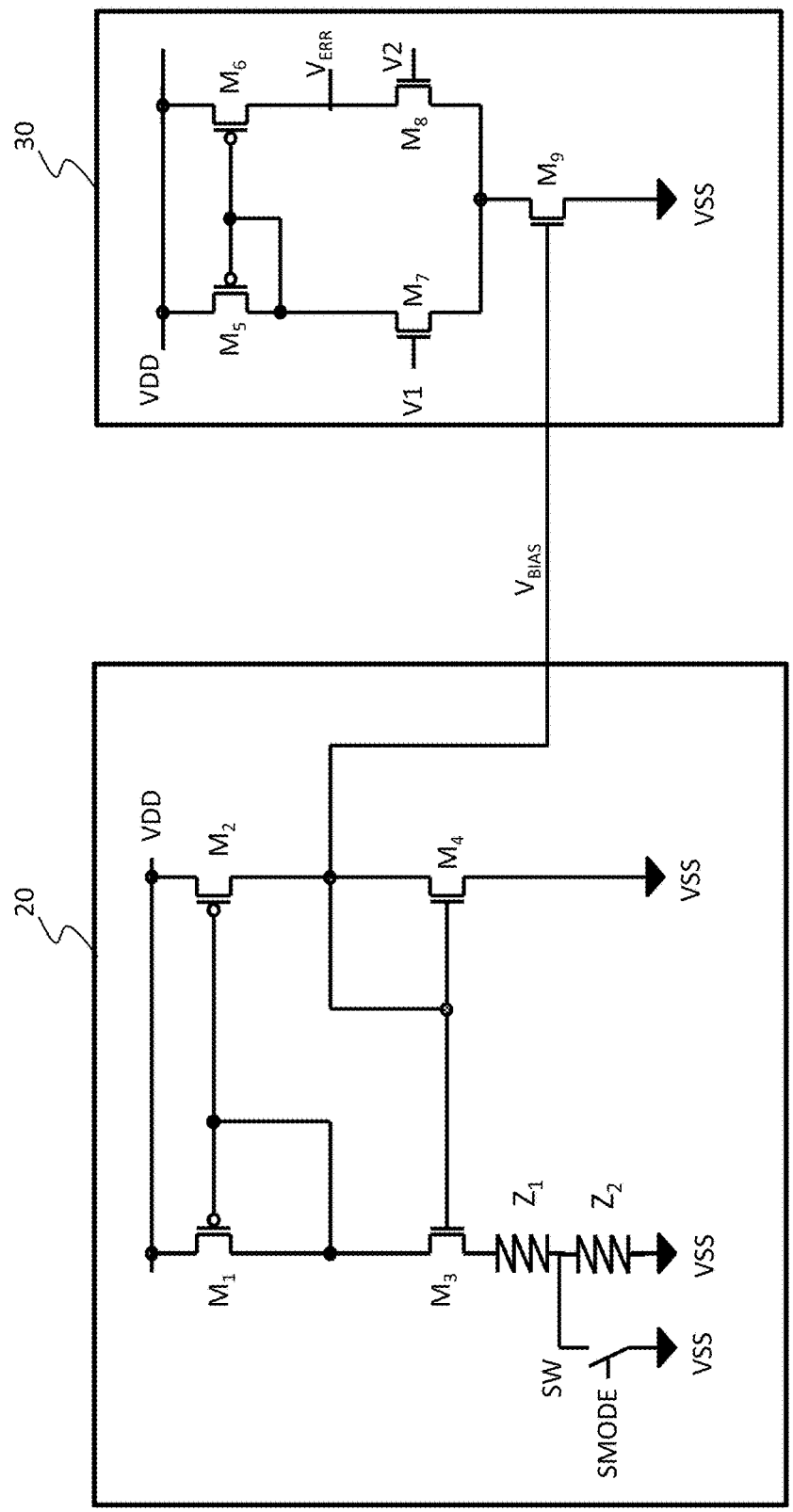
FIG. 5 is a schematic diagram of a bias generator and an error amplifier in a band-gap reference circuit in accordance with at least some embodiments of the present disclosure.
Figure 6:
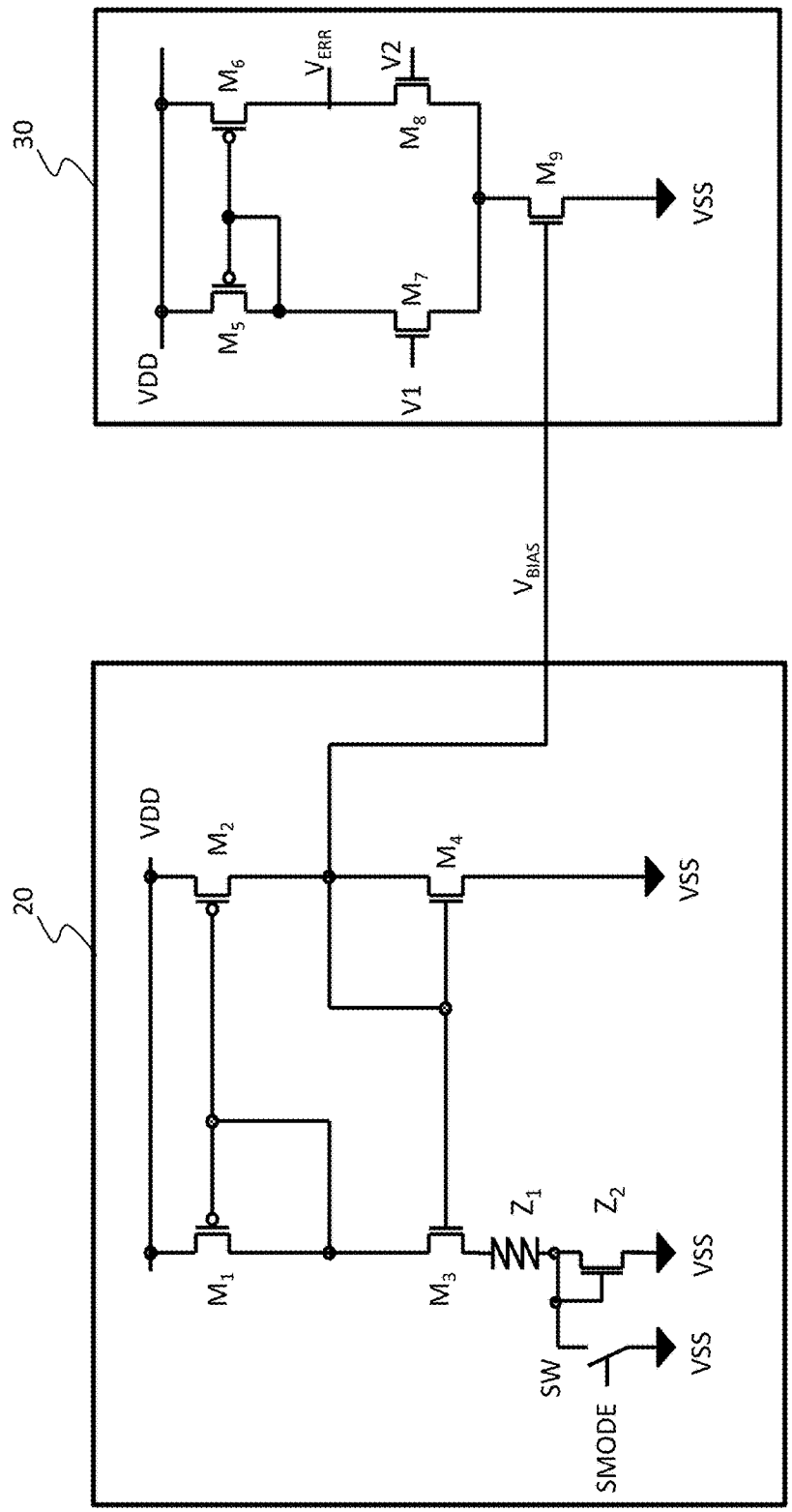
FIG. 6 is a schematic diagram of a bias generator and an error amplifier in a band-gap reference circuit in accordance with at least some embodiments of the present disclosure.
Figure 7:
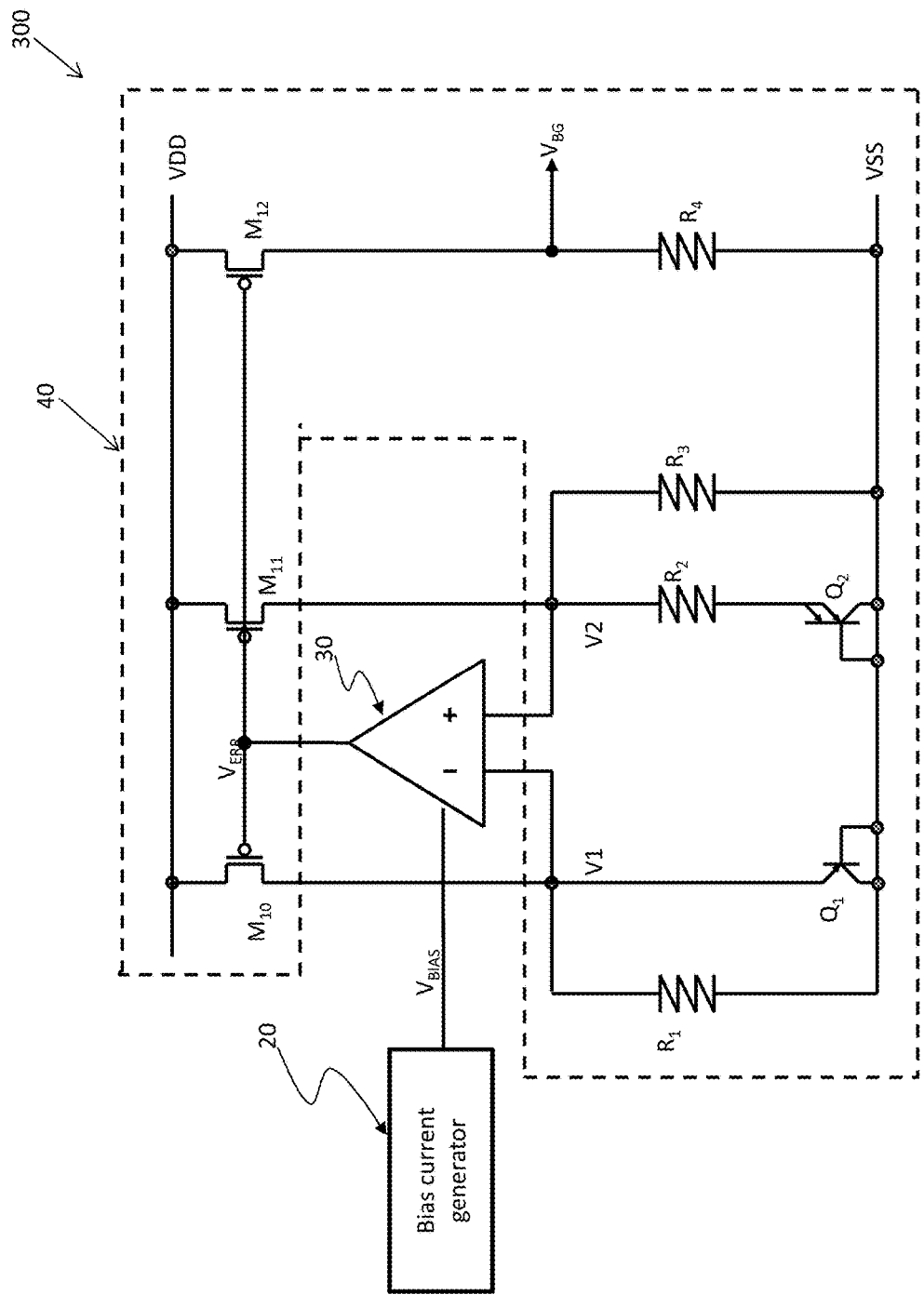
FIG. 7 is a schematic diagram of a band-gap loop circuit in a band-gap reference circuit in accordance with at least some embodiments of the present disclosure.

FIG. 5 and FIG. 6 are schematic diagrams of the bias generator 20 and the error amplifier 30 in the band-gap reference circuit 300 in accordance with at least some embodiments of the present disclosure. FIG. 7 is a schematic diagram of the band-gap loop circuit 40 in the band-gap reference circuit 300 in accordance with at least some embodiments of the present disclosure.

As depicted in FIG. 5 and FIG. 6, the bias generator 20 includes transistors M1~M4, resistive elements Z1~Z2, and a switch SW. In accordance with some embodiments of the present disclosure, the transistors M1~M2 may be P-type metal-oxide-semiconductor-field-effect transistors (MOSFETs), and the transistors M3~M4 may be N-type MOSFETs. The transistor M1 includes a source coupled to a voltage supply VDD, a drain, and a gate coupled to the drain of the transistor M1. The transistor M2 includes a source coupled to the voltage supply VDD, a drain for outputting a bias voltage $V_{BIAS}$, and a gate coupled to the gate of the transistor M1. The transistor M3 includes a drain coupled to the drain of the transistor M1, and a gate coupled to the drain of the transistor M2. The transistor M4 includes a drain coupled to the drain of the transistor M2, a source coupled to the voltage supply VSS, and a gate coupled to the gate of the transistor M3. The resistive elements Z1 and Z2 are coupled in series between the source of the transistor M3 and the voltage supply VSS. The switch SW includes a first end coupled between the resistive elements Z1~Z2, a second end coupled to the voltage supply VSS, and a control end coupled to receive the mode selection signal $S_{MODE}$.

In the present disclosure, the bias generator 20 is configured to adjusting its bias condition according to the operational mode of the band-gap reference circuit 300. In accordance with some embodiments of the present disclosure, when the image sensor operates in the normal mode, the mode selection signal S1 is set to a first level (such as logic 1) which turns on (short-circuited) the switch SW and allows the band-gap reference circuit 300 to operate in the ON mode; when the image sensor operates in the standby mode, the mode selection signal S1 is set to a second level (such as logic 0) which turns off (open-circuited) the switch SW and allows the band-gap reference circuit 300 to operate in the low-power mode. This way, the current flowing through the transistor M3 is defined by the resistive element Z1 in the ON mode and by the resistive elements Z1~Z2 in the low-power mode. Since the resistance of (Z1+Z2) is larger than Z1, the bias current of the bias generator 20, as well as the bias voltage $V_{BIAS}$ supplied to the error amplifier 30, can be reduced in the low-power mode, thereby reducing power consumption.

In accordance with some embodiments of the present disclosure, the resistance of the resistive element Z2 may be much larger than the resistance of the resistive element Z1 so as to substantially lower the bias current of the bias generator 20 during the low-power mode. In the embodiment depicted in FIG. 5, the resistive elements Z1 and Z2 may be resistors. In the embodiment depicted in FIG. 6, the resistive element Z1 may be a resistor, and the resistive element Z2 may be a diode-connected transistor.

As depicted in FIG. 5 and FIG. 6, the error amplifier 30 includes transistors M5~M9. In accordance with some embodiments of the present disclosure, the transistors M5~M6 may be P-type MOSFETs, and the transistors M7~M9 may be N-type MOSFETs. The transistor M5 includes a source coupled to the voltage supply VDD, a drain, and a gate coupled to the drain of the transistor M5. The transistor M6 includes a source coupled to the voltage supply VDD, a drain for outputting the error voltage $V_{ERR}$, and a gate coupled to the gate of the transistor M5. The transistor M7 includes a drain coupled to the drain of the transistor M5, a source, and a gate coupled to the negative input end of the error amplifier 30. The transistor M8 includes a drain coupled to the drain of the transistor M6, a source, and a gate coupled to the positive input end of the error amplifier 30. The transistor M9 includes a drain coupled to the source of the transistor M7, a source coupled to the voltage supply VSS, and a gate coupled to the bias generator 20 for receiving the bias voltage $V_{BIAS}$.

As depicted in FIG. 7, the band-gap loop circuit 40 includes transistors M10~M12 and Q1~Q2, and resistors R1~R4. In accordance with some embodiments of the present disclosure, the transistors M1~M3 may be P-type MOS- FETs, and the transistors Q1~Q2 may be bipolar junction transistors (BJTs). The transistor M1 includes a source coupled to the voltage supply VDD, a drain coupled to the negative input end of the error amplifier 30, and a gate coupled to the output end of the error amplifier 30. The transistor M2 includes a source coupled to the voltage supply VDD, a drain coupled to the positive input end of the error amplifier 30, and a gate coupled to the output end of the error amplifier 30. The transistor M3 includes a source coupled to the voltage supply VDD, a drain coupled to the output end of the band-gap loop circuit 40, and a gate coupled to the output end of the error amplifier 30. The transistor Q1 includes an emitter coupled to a negative input end of the error amplifier 30, a collector coupled to the voltage supply VSS, and a base coupled to the voltage supply VSS. The transistor Q2 includes an emitter, a collector coupled to the voltage supply VSS, and a base coupled to the voltage supply VSS. The resistor R1 is coupled between the negative input end of the error amplifier 30 and the voltage supply VSS. The resistor R2 is coupled between the positive input end of the error amplifier 30 and the emitter of the transistor Q2. The resistor R3 is coupled between the positive input end of the error amplifier 30 and the voltage supply VSS. The resistor R4 is coupled between the drain of the transistor M12 and the voltage supply VSS.

In the band-gap loop circuit 40, each of the transistors Q1~Q2 and M1~M3 either has a positive temperature coefficient or a negative temperature coefficient so that the band-gap reference circuit 300 may provide a desired temperature characteristic. The level of a voltage V1 supplied to the negative input end of the error amplifier 30 is associated with the current flowing through the transistors Q1 and M1, and the level of a voltage V2 supplied to the positive input end of the error amplifier 30 is associated with the current flowing through the transistors Q2 and M2. Therefore, the error amplifier 30 is able to provide a feedback mechanism so that the current flowing through the transistor M12 can be adjusted in order to provide a stable band-gap reference voltage $V_{BG}$. When detecting any difference between the voltages V1 and V2, the error amplifier 30 is configured to generate the compensating error voltage $V_{ERR}$ which drives the gates of the transistors M10~M12 accordingly, thereby moving the output band-gap reference voltage $V_{BG}$ towards its design specification.

Figure 8:
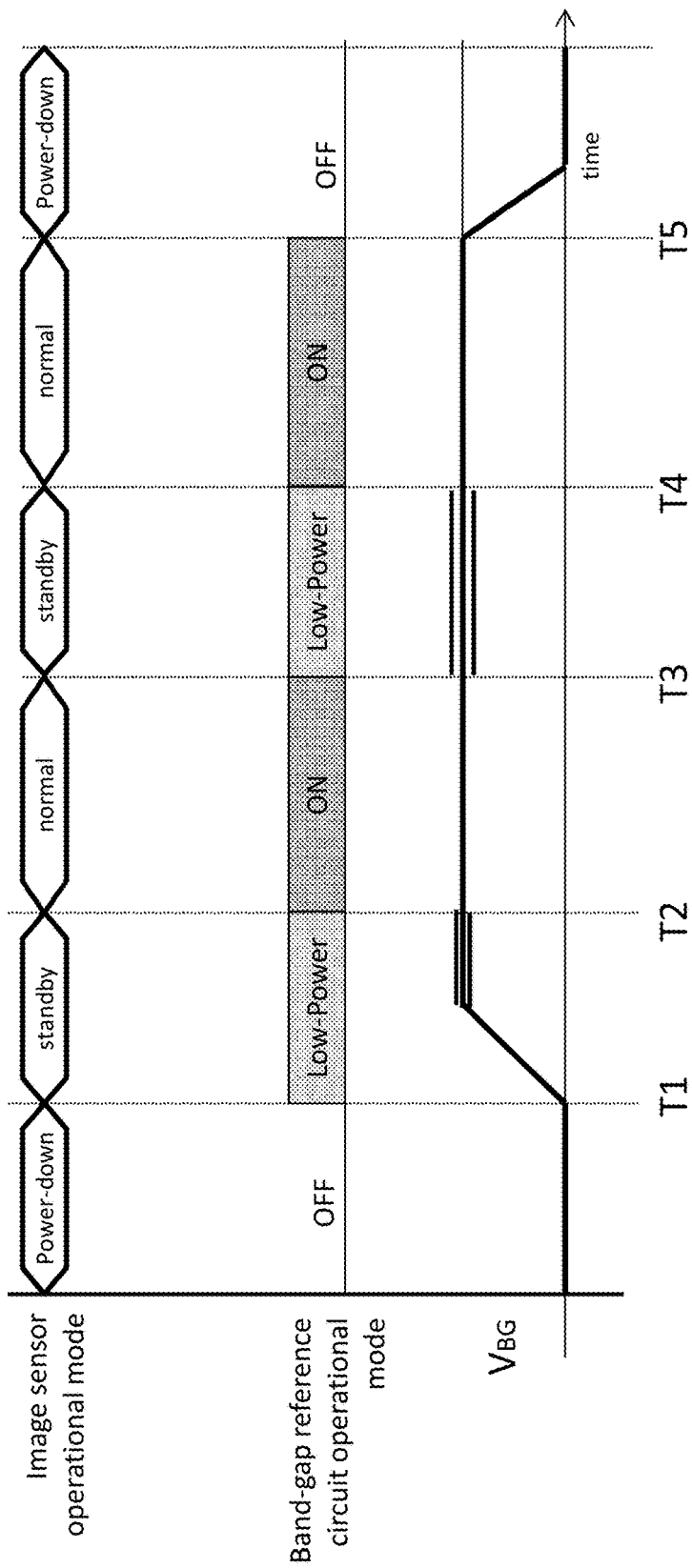
FIG. 8 is a timing diagram illustrating the operations of an analog block in an image sensor in accordance with some embodiments of the present disclosure.

FIG. 8 is a timing diagram illustrating the operations of the analog block 100 for use in an image sensor in accordance with some embodiments of the present disclosure. Before T1 when the image sensor is powered off, the band-gap reference circuit 300 operates in the OFF mode and the band-gap reference voltage $V_{BG}$ is zero. At T1 when the image sensor is powered on and enters the standby mode, the band-gap reference circuit 300 operates in the low-power mode and the band-gap reference voltage $V_{BG}$ ramps up to a non-zero level. Although an ideal error amplifier has unlimited gain and no offset error, the output of the error amplifier 30 in real application inevitably varies with the bias voltage $V_{BIAS}$. Since the bias voltage $V_{BIAS}$ is reduced during the low-power mode, the level of the band-gap reference voltage $V_{BG}$ may slightly fluctuate around its nominal level. However, since the image sensor is still getting ready for normal mode operations in the standby mode and does not require the band-gap reference voltage $V_{BG}$ to be kept at its nominal level, such voltage fluctuation is not an issue.

At T2 when the image sensor switches to the normal mode, the band-gap reference circuit 300 operates in the ON mode and outputs the band-gap reference voltage $V_{BG}$ of the nominal level for normal mode operations of the image sensor. At T3 when the image sensor switches to the standby mode, the band-gap reference circuit 300 switches to the low-power mode in which the band-gap reference circuit 300 operates in a reduced bias condition. As previously stated, the band-gap reference voltage $V_{BG}$ may slightly fluctuate around its nominal level in the standby mode, but such voltage fluctuation does not affect the normal mode operations of the image sensor. At T4 when the image sensor switches back to the normal mode, the band-gap reference circuit operates in the ON mode and outputs the band-gap reference voltage $V_{BG}$ of the nominal level for normal operations of the image sensor. At T5 when the image sensor is powered off (e.g., in power-down mode), the band-gap reference circuit 300 is turned off and the band-gap reference voltage $V_{BG}$ drops to zero.

Between T2~T3 and T3~T4 when the image sensor operates in the standby mode, the present band-gap reference circuit 300 operates in the low-power mode with a reduced bias condition and provides a non-zero band-gap reference voltage $V_{BG}$. The reduced bias condition can lower power consumption of the analog block 100, while the non-zero band-gap reference voltage $V_{BG}$ can shorten the settling time for the image sensor to resume normal mode operations after switching from the standby mode to the normal mode.

Figure 9:
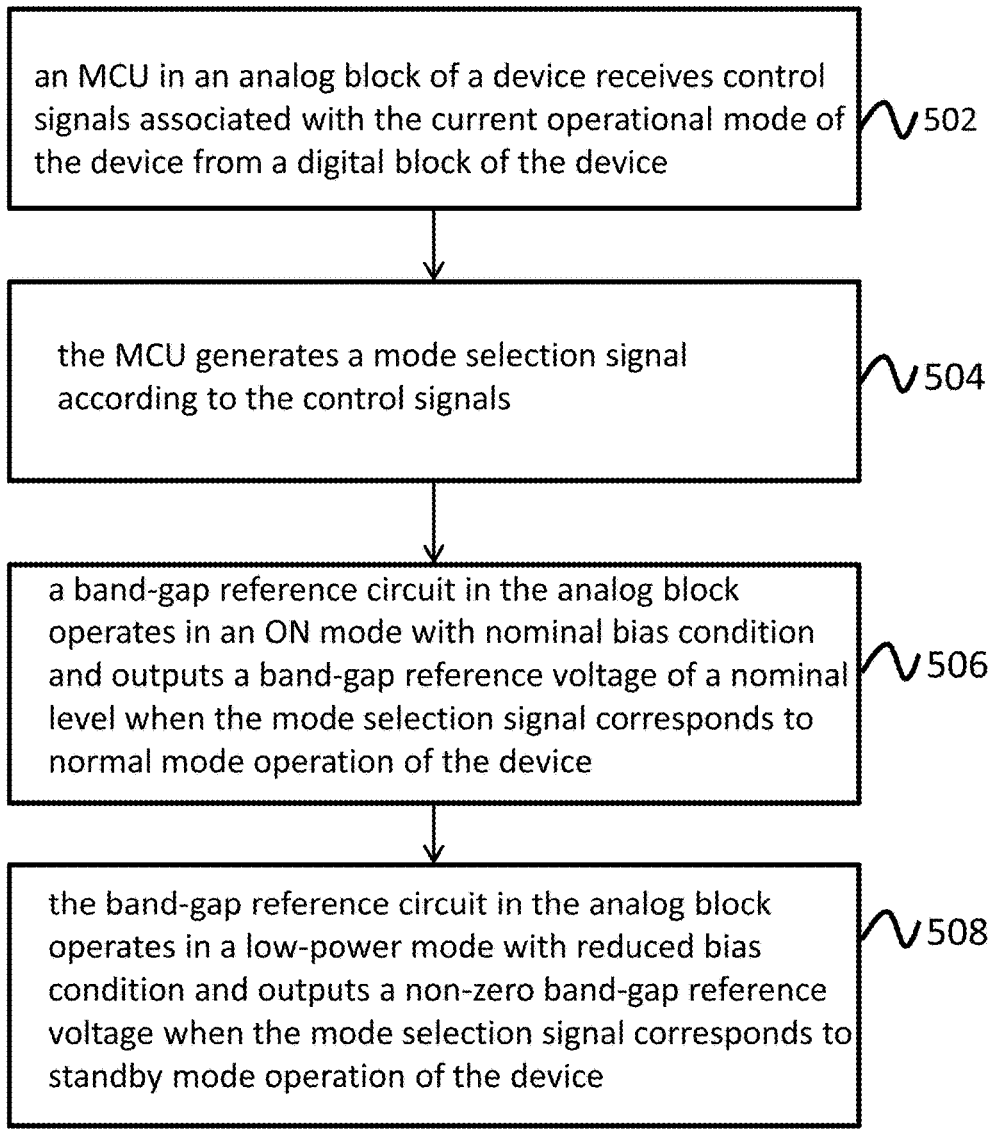
FIG. 9 is a flowchart of an illustrative embodiment of a method for operating an analog block in accordance with at least some embodiments of the present disclosure.

FIG. 9 is a flowchart of an illustrative embodiment of a method 50 for operating the analog block in accordance with at least some embodiments of the present disclosure. Method 50 may include one or more operations, functions or actions as illustrated by one or more of blocks 502, 504, 506, and/or 508. The various blocks may be combined into fewer blocks, divided into additional blocks, and/or eliminated based upon the desired implementation. Processing for method 50 may begin at block 502, "an MCU in an analog block of a device receives control signals associated with the current operational mode of the device from a digital block of the device". Block 502 may be followed by block 504, "the MCU generates a mode selection signal according to the control signals". Block 504 may be followed by block 506, "a band-gap reference circuit in the analog block operates in an ON mode with nominal bias condition and outputs a band-gap reference voltage of a nominal level when the mode selection signal corresponds to normal mode operation of the device". Block 506 may be followed by block 508, "the band-gap reference circuit in the analog block operates in a low-power mode with a reduced bias condition and outputs a non-zero band-gap reference voltage when the mode selection signal corresponds to standby mode operation of the device."

Although the present disclosure has been described with reference to specific exemplary embodiments, it will be recognized that the disclosure is not limited to the embodiments described, but can be practiced with modification and alteration within the spirit and scope of the appended claims. Accordingly, the specification and drawings are to be regarded in an illustrative sense rather than a restrictive sense.

We claim:

1. An analog block implemented with a band-gap reference scheme for use in a device, comprising:
   a mode control unit configured to generate a mode selection signal; and
   a band-gap reference circuit, comprising:
      a bias generator comprising:
         a first transistor including:
            a first end coupled to a first voltage supply;
            a second end; and a control end coupled to the second end of the first transistor;
a second transistor including:
a first end coupled to the first voltage supply;
a second end for outputting a bias voltage; and
a control end coupled to the control end of the first transistor;
a third transistor including:
a first end coupled to the second end of the first transistor;
a second end; and
a control end coupled to the second end of the second transistor;
a fourth transistor including:
a first end coupled to the second end of the second transistor;
a second end coupled to a second voltage supply; and
a control end coupled to the second end of the second transistor;
a first resistive element and a second element coupled in series between the second end of the third transistor and the second voltage supply; and
a switch configured to receive the mode selection signal and selectively couple a node between the first resistive element and the second resistive element to the second voltage supply according to the mode selection signal;
an error amplifier configured to generate an error voltage according to the bias voltage; and
a band-gap loop circuit configured to provide a band-gap reference voltage according to the error voltage.

2. The analog block of claim 1, wherein the mode control unit comprises:
an OR gate including:
a first input coupled to receive a first control signal associated with a normal mode of the device;
a second input coupled to receive a second control signal associated with a standby mode of the device; and
an output end;
a multiplexer including:
a first input coupled to the output end of the OR gate;
a second input coupled to receive the first control signal;
a select line coupled to receive a low-power control signal; and
an output end; and
a buffer including:
an input coupled to the output end of the multiplexer; and
an output end for outputting the mode selection signal according to the first control signal, the second control signal and the low-power control signal.

3. The analog block of claim 1, wherein the error amplifier comprises:
a fifth transistor including:
a first end coupled to the first voltage supply;
a second end; and
a control end coupled to the second end of the fifth transistor;
a sixth transistor including:
a first end coupled to the first voltage supply;
a second end; and
a control end coupled to the control end of the fifth transistor;
a seventh transistor including:
a first end coupled to the second end of the fifth transistor;
a second end; and
a control end coupled to a negative input end of the error amplifier;
an eighth transistor including:
a first end coupled to the second end of the sixth transistor;
a second end; and
a control end coupled to a positive input end of the error amplifier;
a ninth transistor including:
a first end coupled to the second end of the seventh transistor;
a second end coupled to the second voltage supply; and
a control end coupled to receive the bias voltage.

4. The analog block of claim 3, wherein the band-gap loop circuit comprises:
a tenth transistor including:
a first end coupled to the first voltage supply;
a second end coupled to the negative input end of the error amplifier; and
a control end coupled to an output end of the error amplifier;
an eleventh transistor including:
a first end coupled to the first voltage supply;
a second end coupled to the positive input end of the error amplifier; and
a control end coupled to the output end of the error amplifier;
a twelfth transistor including:
a first end coupled to the first voltage supply;
a second end for outputting the band-gap reference voltage; and
a control end coupled to the output end of the error amplifier;
a thirteenth transistor including:
a first end coupled to the negative input end of the error amplifier;
a second end coupled to the second voltage supply; and
a control end coupled to the second voltage supply;
a fourteenth transistor including:
a first end;
a second end coupled to the second voltage supply; and
a control end coupled to the second voltage supply;
a first resistor coupled between the negative input end of the error amplifier and the second voltage supply;
a second resistor coupled between the positive input end of the error amplifier and the first end of the fourteenth transistor;
a third resistor coupled between the positive input end of the error amplifier and the second voltage supply; and
a fourth resistor coupled between the second end of the twelfth transistor and the second voltage supply.

5. The analog block of claim 1, wherein each of the first resistive element and the second element is a resistor.

6. The analog block of claim 1, wherein the first resistive element is a resistor and the second resistive element is a diode-connected transistor.

7. An analog block implemented with a band-gap reference scheme for use in a device, comprising:
a mode control unit configured to generate a mode selection signal; and
a band-gap reference circuit, comprising:
a bias generator configured to receive the mode selection signal and provide a band-gap reference voltage in a first bias state when the device operates in a normal mode or in a second bias state when the device operates in a standby mode;
an error amplifier configured to generate an error voltage according to a bias voltage; and
a band-gap loop circuit configured to provide a band-gap reference voltage according to the error voltage, wherein first current flowing through the bias generator in the first bias state is larger than second current flowing through the bias generator in the second bias state.

8. The analog block of claim 7, wherein the mode control unit comprises:
an OR gate including:
a first input coupled to receive a first control signal associated with a normal mode of the device;
a second input coupled to receive a second control signal associated with a standby mode of the device; and
an output end;
a multiplexer including:
a first input coupled to the output end of the OR gate;
a second input coupled to receive the first control signal;
a select line coupled to receive a low-power control signal; and
an output end; and
a buffer including:
an input coupled to the output end of the multiplexer; and
an output end for outputting the mode selection signal according to the first control signal, the second control signal and the low-power control signal.

9. The analog block of claim 7, wherein the bias generator comprises:
a first transistor including:
a first end coupled to a first voltage supply;
a second end; and
a control end coupled to the second end of the first transistor;
a second transistor including:
a first end coupled to the first voltage supply;
a second end for outputting the bias voltage; and
a control end coupled to the control end of the first transistor;
a third transistor including:
a first end coupled to the second end of the first transistor;
a second end; and
a control end coupled to the second end of the second transistor;
a fourth transistor including:
a first end coupled to the second end of the second transistor;
a second end coupled to a second voltage supply; and
a control end coupled to the second end of the second transistor;
a first resistive element and a second element coupled in series between the second end of the third transistor and the second voltage supply; and
a switch configured to selectively couple a node between the first resistive element and the second resistive element to the second voltage supply according to the mode selection signal.

10. The analog block of claim 9, wherein each of the first resistive element and the second element is a resistor.

11. The analog block of claim 9, wherein the first resistive element is a resistor and the second resistive element is a diode-connected transistor.

12. The analog block of claim 7, wherein the error amplifier comprises:
a fifth transistor including:
a first end coupled to a first voltage supply;
a second end; and
a control end coupled to the second end of the fifth transistor;
a sixth transistor including:
a first end coupled to the first voltage supply;
a second end; and
a control end coupled to the control end of the fifth transistor;
a seventh transistor including:
a first end coupled to the second end of the fifth transistor;
a second end; and
a control end coupled to a negative input end of the error amplifier;
an eighth transistor including:
a first end coupled to the second end of the sixth transistor;
a second end; and
a control end coupled to a positive input end of the error amplifier;
a ninth transistor including:
a first end coupled to the second end of the seventh transistor;
a second end coupled to a second voltage supply; and
a control end coupled to receive the bias voltage.

13. The analog block of claim 7, wherein the band-gap loop circuit comprises:
a tenth transistor including:
a first end coupled to a first voltage supply;
a second end coupled to a negative input end of the error amplifier; and
a control end coupled to an output end of the error amplifier;
an eleventh transistor including:
a first end coupled to the first voltage supply;
a second end coupled to a positive input end of the error amplifier; and
a control end coupled to the output end of the error amplifier;
a twelfth transistor including:
a first end coupled to the first voltage supply;
a second end for outputting the band-gap reference voltage; and
a control end coupled to the output end of the error amplifier;
a thirteenth transistor including:
a first end coupled to the negative input end of the error amplifier;
a second end coupled to a second voltage supply; and
a control end coupled to the second voltage supply;
a fourteenth transistor including:
a first end;
a second end coupled to the second voltage supply; and
a control end coupled to the second voltage supply;
a first resistor coupled between the negative input end of the error amplifier and the second voltage supply;
a second resistor coupled between the positive input end of the error amplifier and the first end of the fourteenth transistor;
a third resistor coupled between the positive input end of the error amplifier and the second voltage supply; and
a fourth resistor coupled between the second end of the twelfth transistor and the second voltage supply.

14. A method of operating a band-gap reference scheme with an analog block in a device, comprising:
receiving, by a mode control unit in the analog block, control signals;
generating a mode selection signal, by the mode control unit according to the control signals;
operating, by a band-gap reference circuit in the analog block, in a first mode with a nominal bias condition and outputting a band-gap reference voltage of a nominal level when the mode selection signal corresponds to a normal mode operation of the device; and operating, by the band-gap reference circuit, in a second mode with a reduced bias condition and outputting a non-zero band-gap reference voltage when the mode selection signal corresponds to a standby mode operation of the device.

15. The method of claim 14, wherein the control signals comprise:

a first set of control signals corresponding to the normal mode operation of the device; or a second set of control signals corresponding to the standby mode operation of the device.

16. The method of claim 14, wherein the operating in the first mode with the nominal bias condition further comprises turning on a first switch according to the mode selection signal.

17. The method of claim 16, wherein the operating in the second mode with the reduced bias condition further comprises turning off the first switch according to the mode selection signal.

18. The method of claim 14, wherein the non-zero band-gap reference voltage is configured to fluctuate around the band-gap reference voltage.

* * * * *